United States Patent
Tsai

(10) Patent No.: US 9,565,785 B2
(45) Date of Patent: Feb. 7, 2017

(54) FAN SECURING DEVICE AND FAN ASSEMBLY HAVING THE SAME

(71) Applicant: Wistron Corporation, New Taipei (TW)

(72) Inventor: Chi-Ken Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 475 days.

(21) Appl. No.: 14/186,173

(22) Filed: Feb. 21, 2014

(65) Prior Publication Data

US 2014/0241875 A1    Aug. 28, 2014

(30) Foreign Application Priority Data

Feb. 22, 2013   (TW) .............................. 102106263 A

(51) Int. Cl.
 *F04D 29/52*     (2006.01)
 *H05K 7/20*      (2006.01)
(52) U.S. Cl.
 CPC ................................. *H05K 7/20172* (2013.01)
(58) Field of Classification Search
 CPC ............ H05K 7/20172; H05K 7/20136; F04D 29/522; F04D 29/005; F04D 29/12; F04D 29/08
 See application file for complete search history.

(56) References Cited

U.S. PATENT DOCUMENTS

| | | | | |
|---|---|---|---|---|
| 6,921,247 B2 * | 7/2005 | Stewart | ................. | F04D 29/601 415/213.1 |
| 7,251,135 B2 * | 7/2007 | Crippen | ............. | H05K 7/20172 165/104.33 |
| 8,379,387 B2 * | 2/2013 | Chuang | .............. | H05K 7/20172 361/690 |
| 8,851,924 B2 * | 10/2014 | Fleischmann | ........... | F04D 25/08 439/587 |
| 2012/0156030 A1 | 6/2012 | Shu | | |

FOREIGN PATENT DOCUMENTS

| | | |
|---|---|---|
| CN | 201352892 Y | 11/2009 |
| CN | 102566694 A | 7/2012 |
| TW | M319633 | 9/2007 |

OTHER PUBLICATIONS

The Office Action issued to Chinese Counterpart Application No. 201310078731.3 by the State Intellectual Property Office of the P.R.C. on Jan. 19, 2016 along with an English translation of sections boxed in red.

* cited by examiner

*Primary Examiner* — Ninh H Nguyen
(74) *Attorney, Agent, or Firm* — Jianq Chyun IP Office

(57) ABSTRACT

A fan securing device includes first and second holders. The first holder includes a first holding frame that has two holding slots located in opposite sides of the first holding frame, and two first locking units respectively formed adjacent to the holding slots. The second holder includes a second holding frame that has two connecting arms located on opposite sides of the second holding frame and extending respectively into the holding slots. Each connecting arm has a plurality of second locking units. Each first locking unit engages a selected one of the second locking units of a respective one of the connecting arms so as to clamp at least one cooling fan between the first and second surfaces.

20 Claims, 10 Drawing Sheets

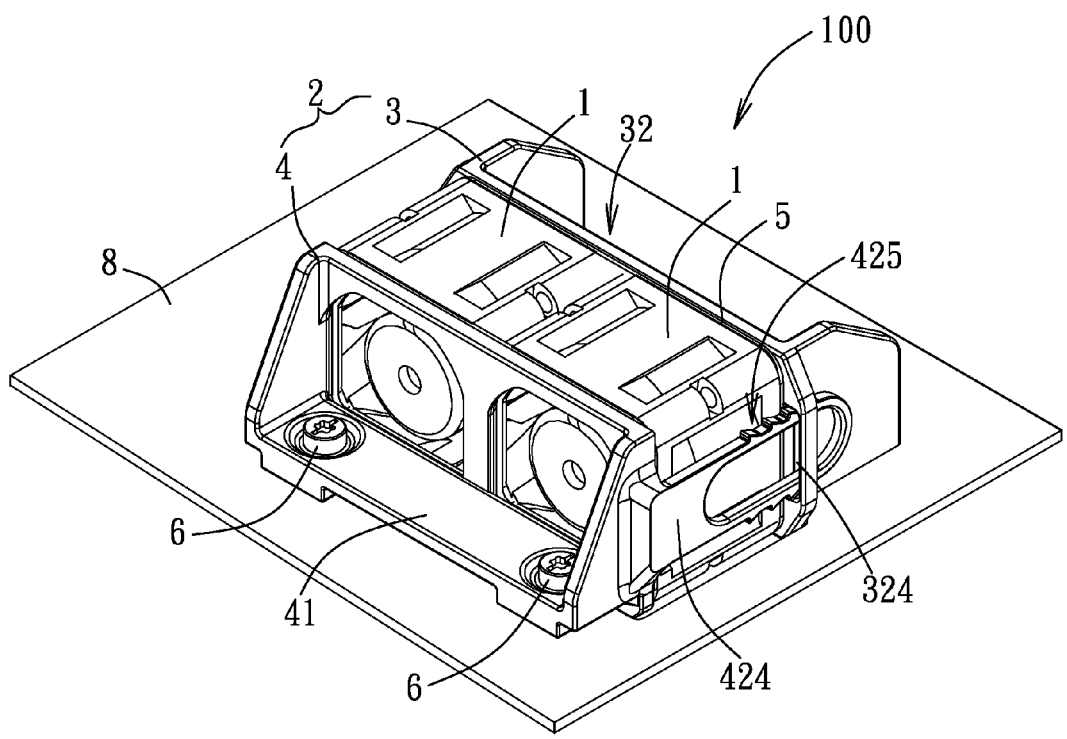
F I G. 2

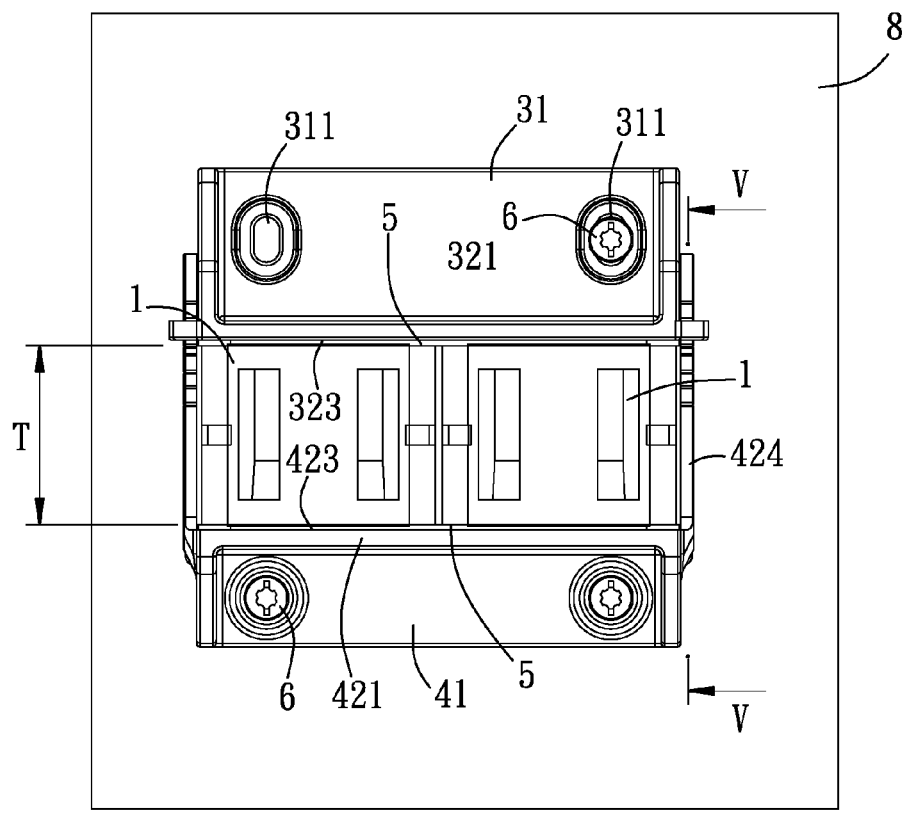
F I G. 4
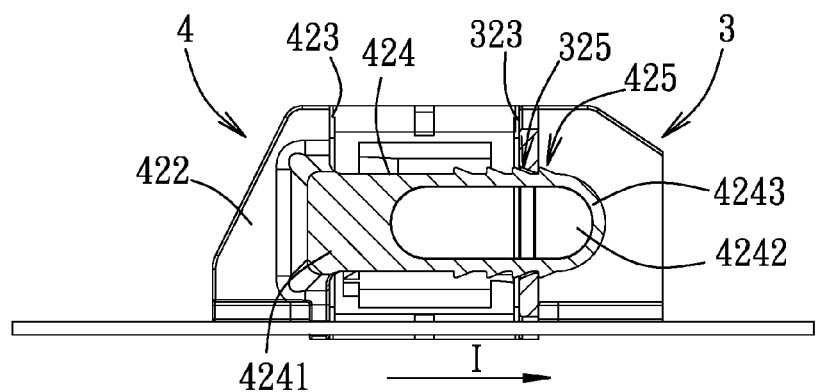
F I G. 5

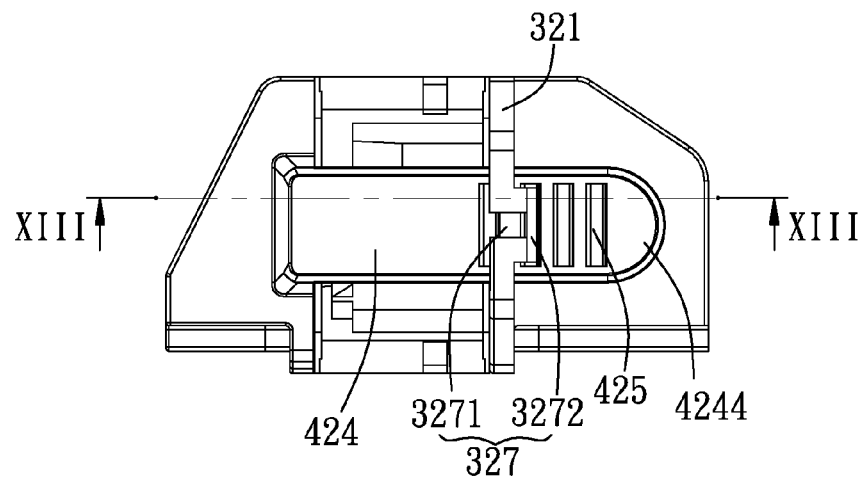
F I G. 12
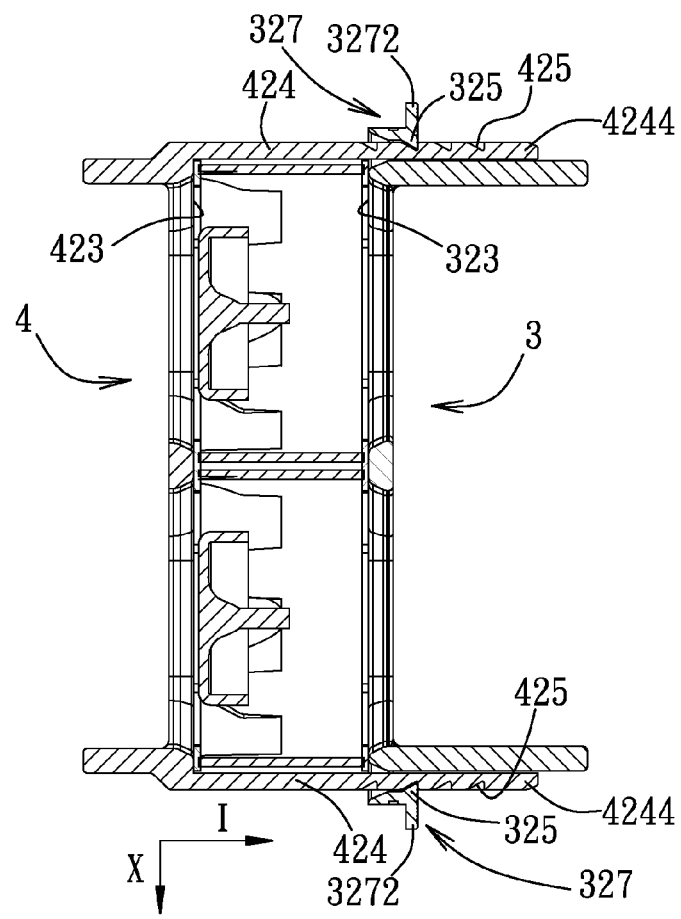
F I G. 13

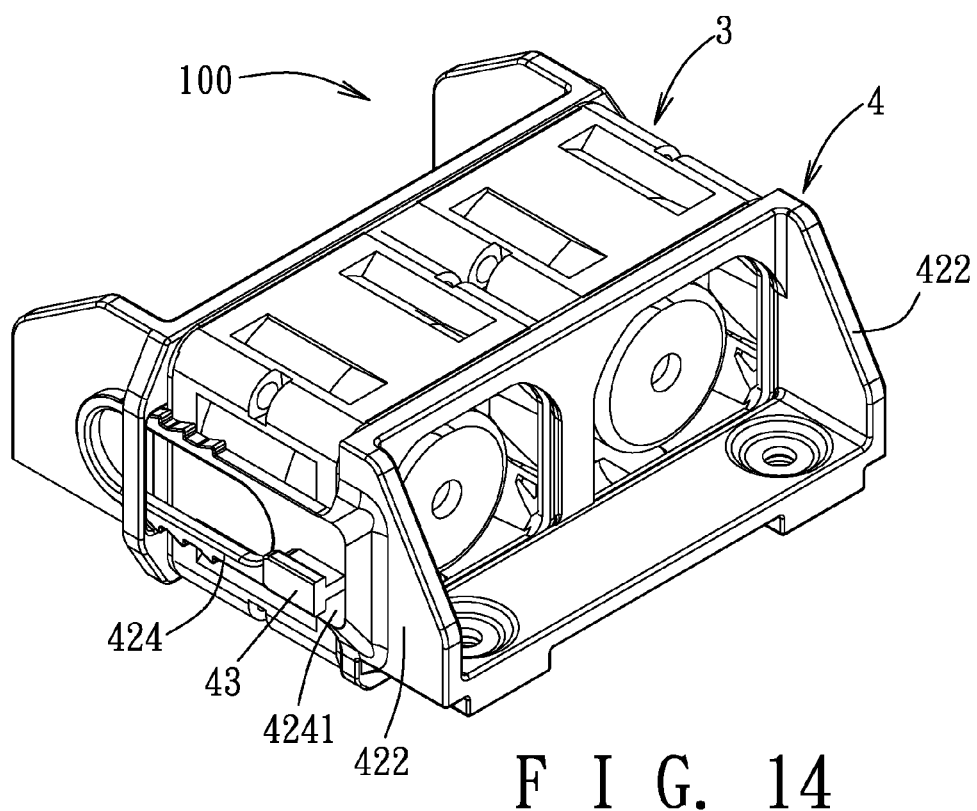
F I G. 14
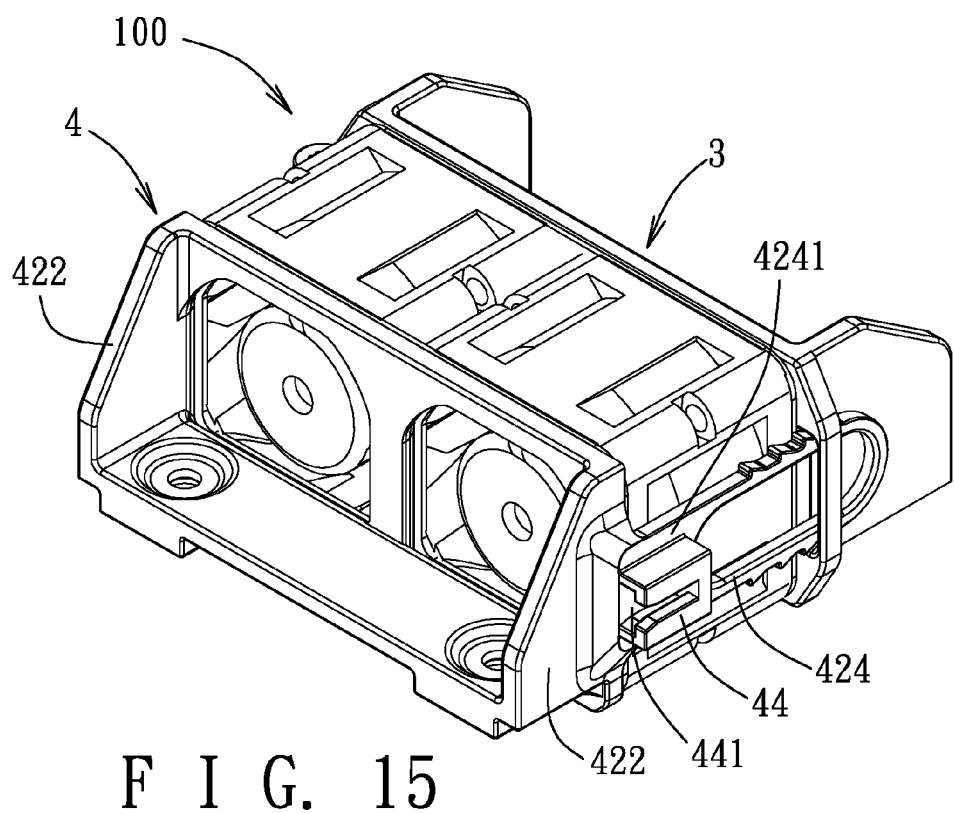
F I G. 15

FAN SECURING DEVICE AND FAN ASSEMBLY HAVING THE SAME

CROSS-REFERENCE TO RELATED APPLICATION

This application claims priority of Taiwan Patent Application No. 102106263, filed on Feb. 22, 2013, the entire disclosure of which is incorporated herein by reference.

BACKGROUND OF THE DISCLOSURE

1. Field of the Disclosure

The disclosure relates to a fan securing device, more particularly to a fan securing device adjustable for holding cooling fans having different thicknesses, and to a fan assembly having the fan securing device.

2. Description of the Related Art

Referring to FIG. 1, a cooling fan 9 for an electronic device generally comprises a fan seat 91 with a square cross-section, and a blade unit 92 that is received rotatably in the fan seat 91. The fan seat 91 has a plurality of positioning holes 911 extending therethrough and respectively located at four corners thereof. The positioning holes 911 allow securing members (not shown) such as bolts to extend respectively therethrough so as to secure the cooling fan 9 to a casing or a support of an electronic device (not shown). Because the positioning holes 911 extend along a direction parallel to that of airflow created by the cooling fan 9, it is impossible to secure the cooling fan 9 directly to a board surface of, for example, a circuit board in a manner that the airflow generated by the cooling fan 9 flows parallel to the board surface. Instead, an auxiliary securing device is required for securing the cooling fan 9 to the board surface.

Furthermore, dimensions of the cooling fan 9, that is, a side length (L) and a thickness (T) of the fan seat 91 may vary. For example, existing fans having a side length (L) of 40 mm may have several configurations with thicknesses (T) of 15 mm, 20 mm, 24 mm, and 28 mm, and the fan specifications may be represented as 40×40×15, 40×40×20, 40×40×24, or 40×40×28.

However, a conventional fan securing device generally is only capable of securing cooling fans of the same dimensions. In other words, the conventional fan securing device cannot be adjusted to match cooling fans of different dimensions.

SUMMARY OF THE DISCLOSURE

Therefore, an object of the present disclosure is to provide a fan securing device that can be combined with a cooling fan into an assembly which is easy to be mounted to an electronic device, and that is adjustable for holding cooling fans having different thicknesses.

Another object of the present disclosure is to provide a fan assembly combining a cooling fan and the fan securing device.

A further object of the present disclosure is to provide a fan assembly which can be connected to an adjacent one of the same.

Accordingly, a fan securing device is adapted to be secured to at least one cooling fan for an electronic device. The fan securing device comprises a first holder including a first base and a first holding frame, and a second holder including a second base and a second holding frame. The first holding frame is connected perpendicularly to the first base, and has a first surface, two holding slots respectively located at opposite sides of the first holding frame and formed in the first surface, and two first locking units respectively formed adjacent to the holding slots. The second holding frame is connected perpendicularly to the second base, and has a second surface and two connecting arms respectively located at opposite sides of the second holding frame, extending beyond the second surface in an extending direction and extendable respectively into the holding slots. Each of the connecting arms is formed with a plurality of second locking units spaced apart from each other in the extending direction. Each of the first locking units engages a selected one of the second locking units of a respective one of the connecting arms so as to clamp the cooling fan between the first surface and the second surface.

Accordingly, a fan assembly comprises at least one cooling fan and a fan securing device. The fan securing device comprises a first holder including a first base and a first holding frame, and a second holder including a second base and a second holding frame. The first holding frame is connected perpendicularly to the first base, and has a first surface, two holding slots respectively located at opposite sides of the first holding frame and formed in the first surface, and two first locking units respectively formed adjacent to the holding slots. The second holding frame is connected perpendicularly to the second base, and has a second surface and two connecting arms respectively located at opposite sides of the second holding frame, extending beyond the second surface in an extending direction and extendable respectively into the holding slots. Each of the connecting arms is formed with a plurality of second locking units spaced apart from each other in the extending direction. Each of the first locking units engages a selected one of the second locking units of a respective one of the connecting arms so as to clamp the cooling fan between the first surface and the second surface.

The effect of the present disclosure lies in that the fan assembly according to the present disclosure combines a cooling fan and a fan securing device into an assembly, which facilitates installation of the same onto a board. Further, the fan securing device and the cooling fan may be easily assembled without the use of bolts or other securing members. Also, shock absorbing members may be respectively disposed between the cooling fan and the first holder and between the cooling fan and the second holder so as to reduce a resonance effect due to vibration when the cooling fan is in operation. Moreover, the fan securing device is suitable for a variety of cooling fans having different thicknesses, thereby simplifying an overall manufacturing process and reducing an overall manufacturing cost required to accommodate different sized cooling fans. Furthermore, a plurality of the fan assemblies of the disclosure may be connected together as desired.

BRIEF DESCRIPTION OF THE DRAWINGS

Other features and advantages of the present disclosure will become apparent in the following detailed description of the embodiments with reference to the accompanying drawings, of which:

FIG. 2 is a perspective view of a first embodiment of a fan assembly according to the present disclosure;

FIG. 4 is a top view of the first embodiment;

FIG. 5 is a sectional view taken along line V-V in FIG. 4;

FIG. 12 is a side view of the third embodiment;

FIG. 13 is a sectional view taken along line XIII-XIII in FIG. 12, illustrating a locking relationship between two first locking units and two of a plurality of second locking units of the third embodiment;

FIG. 14 is a perspective view of a fourth embodiment of the fan assembly according to the present disclosure;

FIG. 15 is another perspective view of the fourth embodiment;

DETAILED DESCRIPTION OF THE EMBODIMENTS

Figure 1:
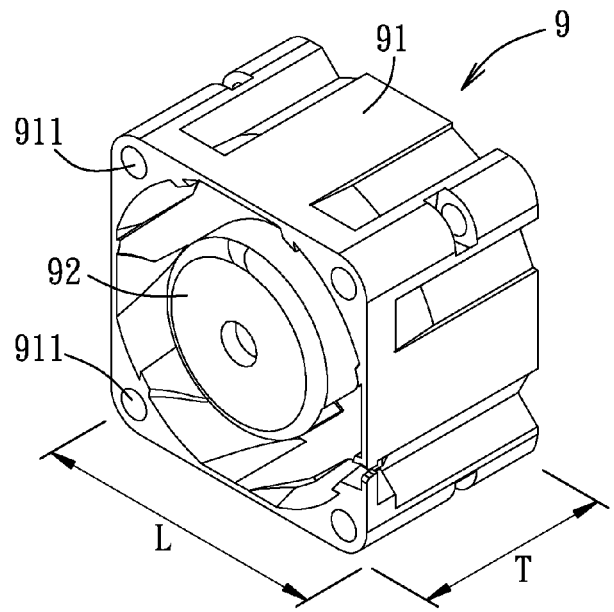
FIG. 1 is a perspective view of a cooling fan.
Figure 3:
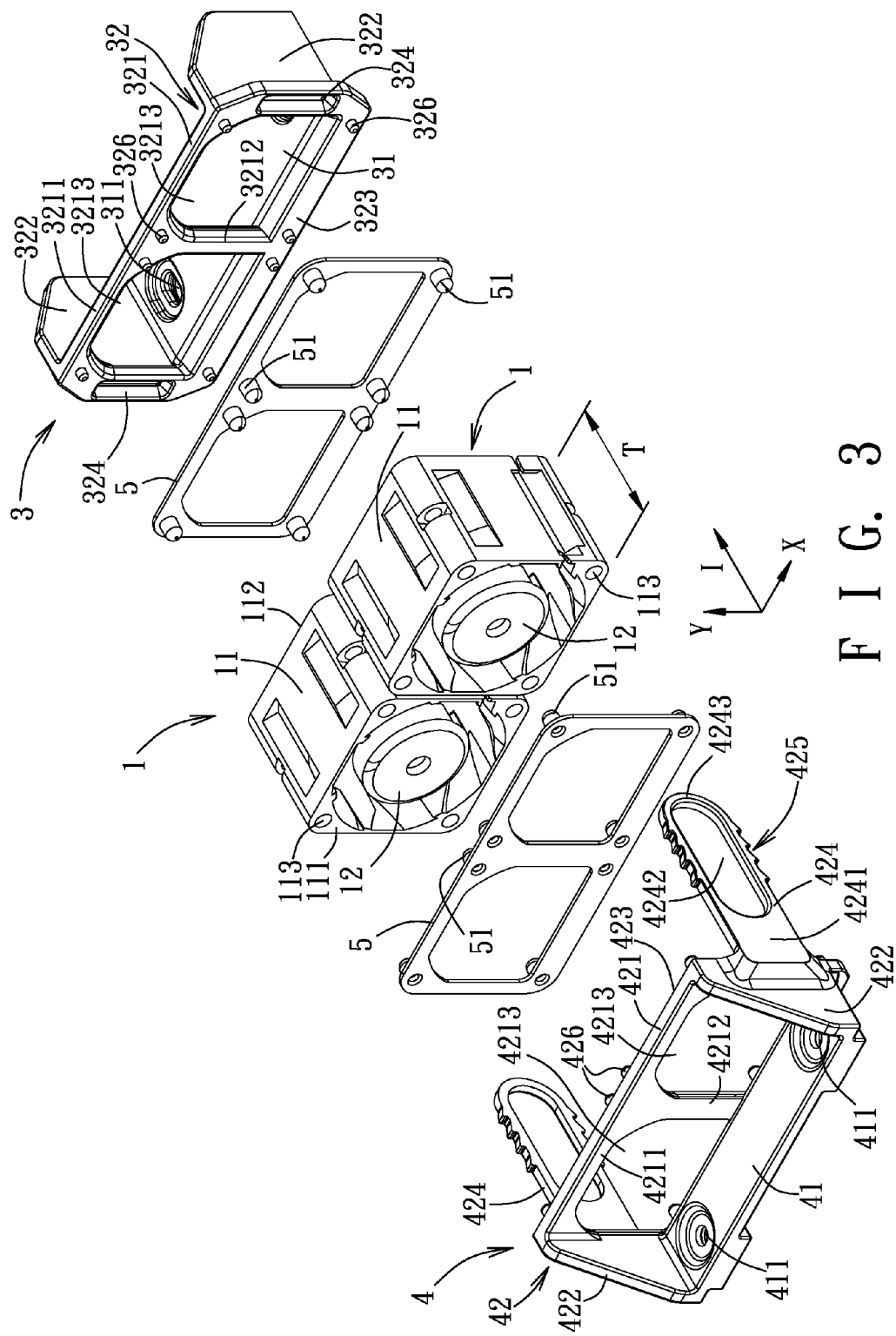
FIG. 3 is an exploded perspective view of the first embodiment.

Before the present disclosure is described in greater detail, it should be noted that like elements are denoted by the same reference numerals throughout the disclosure.

Referring to FIGS. 2 to 5, a first embodiment of a fan assembly 100 according to the present disclosure is adapted to be mounted on a board 8 such as a circuit board, and comprises two identical cooling fans 1 for an electronic device and a fan securing device 2.

Each of the cooling fans 1 includes a fan seat 11 with a square cross-section and a blade unit 12 (where no blade is shown in the figures). The fan seat 11 is hollow and has a front surface 111, a rear surface 112, and a plurality of positioning holes 113 extending through the front surface 111 and the rear surface 112 and respectively located at corners of the fan seat 11.

The fan securing device 2 includes a first holder 3, a second holder 4, and two hollow shock absorbing members 5. The second holder 4 is spaced apart from the first holder 3 in an extending direction (I).

The first holder 3 includes a first base 31 and a first holding frame 32. The first base 31 is formed as a plate, is placed parallel to and on the board 8, and has two securing holes 311 that are spaced apart from each other and that extend therethrough. The first holding frame 32 is connected perpendicularly to the first base 31, and has a first frame body 321, two first side plates 322, a first surface 323, two holding slots 324, and two first locking units 325 respectively formed within the holding slots 324. The first frame body 321 has a substantially rectangular outer frame segment 3211 and a dividing frame segment 3212 connected to and within the outer frame segment 3211. The outer frame segment 3211 and the dividing frame segment 3212 cooperatively define two spaces 3213 respectively corresponding in position to the blade units 12 of the cooling fans 1. The first side plates 322 are spaced apart from each other in a first direction (X) transverse to the extending direction (I) and are connected perpendicularly to the first frame body 321 and the first base 31 so as to enhance a structural strength of the first holding frame 32. The first surface 323 is formed on a side of the first frame body 321 opposite to the first side plates 322 in the extending direction (I). The holding slots 324 are respectively formed in opposite sides of the first holding frame 32. Specifically, the opposite sides of the first holding frame 32 protrude oppositely and respectively from the first side plates 322 in the first direction (X) and are formed respectively with the holding slots 324. Furthermore, the first holding frame 32 further includes a plurality of positioning protrusions 326 protruding from the first surface 323. The positioning protrusions 326 respectively correspond in position to the positioning holes 113 of the cooling fans 1.

The second holder 4 includes a second base 41 and a second holding frame 42. The second base 41 is formed as a plate, is placed parallel to and on the board 8, and has two securing holes 411 that are spaced apart from each other and that extend therethrough. The second holding frame 42 is connected perpendicularly to the second base 41, and has a second frame body 421, two second side plates 422, a second surface 423, and two connecting arms 424. The second frame body 421 also has a substantially rectangular outer frame segment 4211 and a dividing frame segment 4212 connected to and within the outer frame segment 4211. The outer frame segment 4211 and the dividing frame segment 4212 cooperatively define two spaces 4213 respectively corresponding in position to the blade units 12 of the cooling fans 1. The second side plates 422 are spaced apart from each other in the first direction (X) and are connected perpendicularly to the second frame body 421 and the second base 41 so as to enhance a structural strength of the second holding frame 42. The second surface 423 is formed on a side of the second frame body 421 opposite to the second side plates 422 in the extending direction (I). The connecting arms 424 are respectively located at opposite sides of the second side plates 422 and respectively extend into the holding slots 324 in the extending direction (I). Each of the connecting arms 424 is formed with a plurality of second locking units 425 that are spaced apart from each other in the extending direction (I).

In this embodiment, each of the connecting arms 424 has a base portion 4241 connected to a respective one of the second side plates 422, and a flexible portion 4243 extending from the base portion 4241 in the extending direction (I) and having a through hole 4242 so as to have a U-shaped structure that opens toward the base portion 4241. The second locking units 425 are formed on the flexible portions 4243 of the connecting arms 424. Each of the second locking units 425 has two protruding blocks protruding respectively from opposite sides of the flexible portion 4243 of a corresponding one of the connecting arms 424 in a second direction (Y) transverse to the extending direction (I) and the first direction (X), and each of the first locking units 325 includes two stop blocks protruding toward each other for respectively engaging the protruding blocks of one of the second locking units 425 of the respective connecting arm 424. Moreover, the second holding frame 42 further includes a plurality of positioning protrusions 426 protruding from the second surface 423. The positioning protrusions 426 respectively correspond in position to the positioning holes 113 of the cooling fans 1.

The shock absorbing members 5 are respectively provided at the first surface 323 of the first holder 3 and the second surface 423 of the second holder 4, and each of the shock absorbing members 5 has a plurality of hollow projections 51 sleeved respectively on the positioning protrusions 326 and 426 of the respective one of the first and second holding frames 32, 42. In this embodiment, the shock absorbing members 5 are made of rubber.

In use, the second locking units 425 of each of the connecting arms 424 are operated via movement of the second holder 4 relative to the first holder 3 such that a selected one of the second locking units 425 engages the respective one of the first locking units 325, so that the cooling fans 1 are clamped and secured between the first surface 323 of the first holder 3 and the second surface 423 of the second holder 4. In particular, outlines perpendicular to the extending direction (I) of the first frame body 321 of the first holder 3, the second frame body 421 of the second holder 4, the shock absorbing members 5 and the ensemble of the fan seats 11 of the cooling fans 1 are substantially the same. The shock absorbing members 5 abut respectively against the first surfaces 111 and the second surfaces 112 of the fan seats 11, and the hollow projections 51, together with the respective positioning protrusions 326 and 426, respectively extend into the positioning holes 113 of the cooling fans 1 so as to position the cooling fans 1. The shock absorbing members 5 are respectively held between the cooling fans 1 and the first holder 3 and between the cooling fans 1 and the second holder 4 so as to reduce a resonance effect due to vibration when the cooling fans 1 are in operation. Moreover, the spaces 3213 defined by the first holding frame 32 are respectively registered with the spaces 4213 defined by the second holding frame 42 in the extending direction (I), and the spaces 3213 and 4213 cooperatively define air channels corresponding in position to the blade units 12 of the cooling fans 1, so that airflows of the cooling fans 1 pass through the air channels.

The securing holes 311 of the first base 31 and the securing holes 411 of the second base 41 are used for extension of securing members 6 such as bolts therethrough for securing the fan assembly 100 to the board 8. Further, the securing holes 311 of the first base 31 are elliptical holes, so that the securing members 6 may be adjusted in position to extend respectively through locking holes (not shown in the figures) provided in the board 8, thereby allowing a tolerance of the positions of the locking holes during the production of the board 8.

Figure 6:
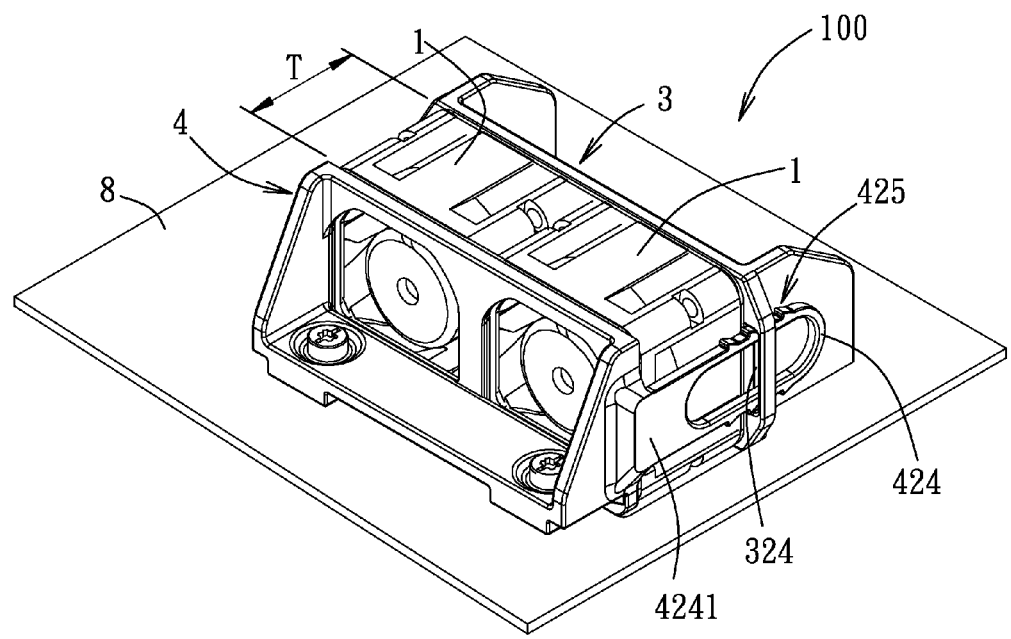
FIG. 6 and FIG. 7 are perspective views illustrating a fan securing device of the first embodiment that holds cooling fans of different thicknesses.
Figure 7:
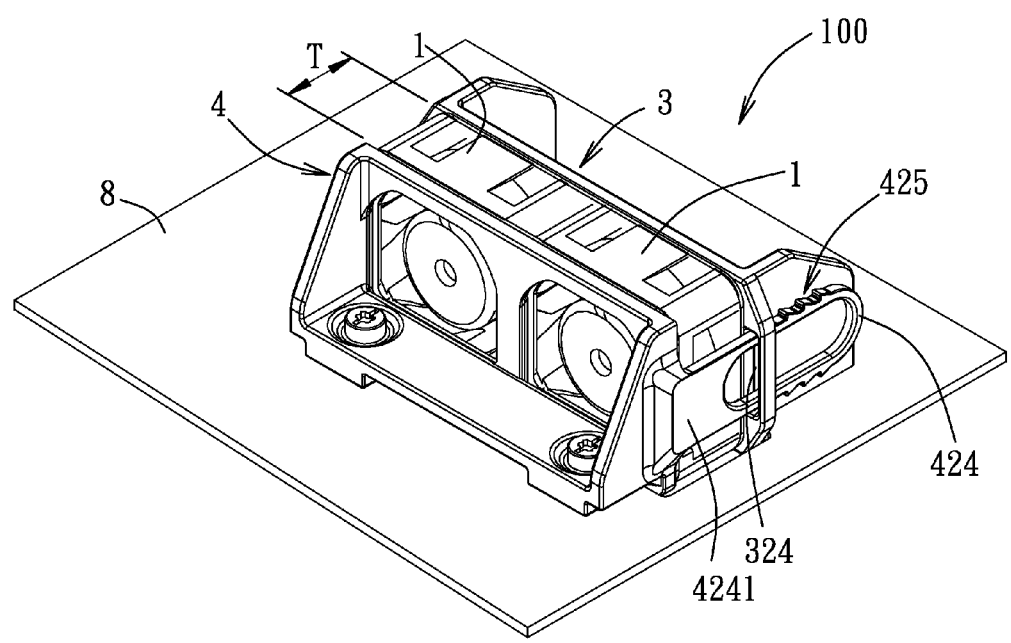

Referring to FIGS. 5 to 7, in this embodiment, the two arms of the U-shaped flexible portion 4243 of each of the connecting arms 424 would be pressed by the respective one of the first locking units 325 to resiliently deform toward each other when the second holder 4 is moved toward the first holder 3. Accordingly, the second locking units 425 can resiliently displace together with the two arms of the U-shaped flexible portion 4243. Furthermore, each of the first locking units 325 and the second locking units 425 has two inclined surfaces. When the connecting arms 424 move along the extending direction (I), the inclined surfaces of each of the first locking units 325 would slide smoothly on the inclined surfaces of at least one of the second locking units 425, and the resilient deformation of the two arms of the U-shaped flexible portion 4243 of each of the connecting arms 424 further facilitates the movement of the second holding frame 42 toward the first holding frame 32. As a result, a distance between the first surface 323 of the first holder 3 and the second surface 423 of the second holder 4 can be easily adjusted so as to match cooling fans 1 having different thicknesses (T). The second locking units 425 that pass through and beyond the first locking units 325 during movement of the second holding frame 42 toward the first holding frame 31, when being moved reversely when the second holding frame 42 is moved away from the first holding frame 31, are stopped by the first locking units 325, so that the first holder 3 and the second holder 4 are positioned relative to each other. When the first locking units 325 respectively engage the farthest ones of the second locking units 425 from the base portions 4241 of the connecting arms 424, a largest distance between the first surface 323 and the second surface 423 is resulted for receiving thick cooling fans 1 (as shown in FIG. 2). When the first locking units 325 engage ones of the second locking units 425 that are closer to the base portions 4241 of the connecting arms 424, the distance between the first surface 323 and the second surface 423 becomes smaller for receiving thinner cooling fans 1 (as shown in FIG. 7). FIG. 6 illustrates a state which the distance between the first surface 323 and the second surface 423 is longer than that shown in FIG. 7 and shorter than that shown in FIG. 2.

Thus, the fan securing device 2 is suitable for a variety of cooling fans 1 having different thicknesses (T), thereby simplifying an overall manufacturing process and reducing an overall manufacturing cost required to accommodate different sized cooling fans. Moreover, the fan securing device 2 may be assembled with the cooling fans 1 conveniently without the use of bolts or other securing members. In particular, the assembly process can be performed by first connecting the cooling fans 1 to one of the first holder 3 and the second holder 4 which is attached with the respective shock absorbing member 5, and then inserting the connecting arms 424 of the second holder 4 respectively into the holding slots 324 of the first holder 3, and moving the second holder 4 and the first holder 3 relative to each other until the cooling fans 1 are clamped securely therebetween and one of the second locking units 425 of each of the connecting arms 424 is engaged with the respective one of the first locking units 325. The fan assembly 100 is then secured to the board 8 using the securing members 6. When it is desired to repair or replace the cooling fans 1, the fan assembly 100 is removed from the board 8, and then the flexible portions 4243 of the connecting arms 424 are pressed to deform, so that the connecting arms 424 are disengaged from the holding slots 324, and the connecting arms 424 can be moved in a direction opposite to the extending direction (I) to separate the first holder 3 from the second holder 4, thereby facilitating removal of the cooling fans 1.

Although the fan securing device 2 according to this embodiment is described to secure two cooling fans 1, the width of the first and second holders 3, 4 in the first direction (X) and the dividing frame segments 3212, 4212 may vary to secure only one cooling fan 1 or more than three cooling fans 1.

Figure 8:
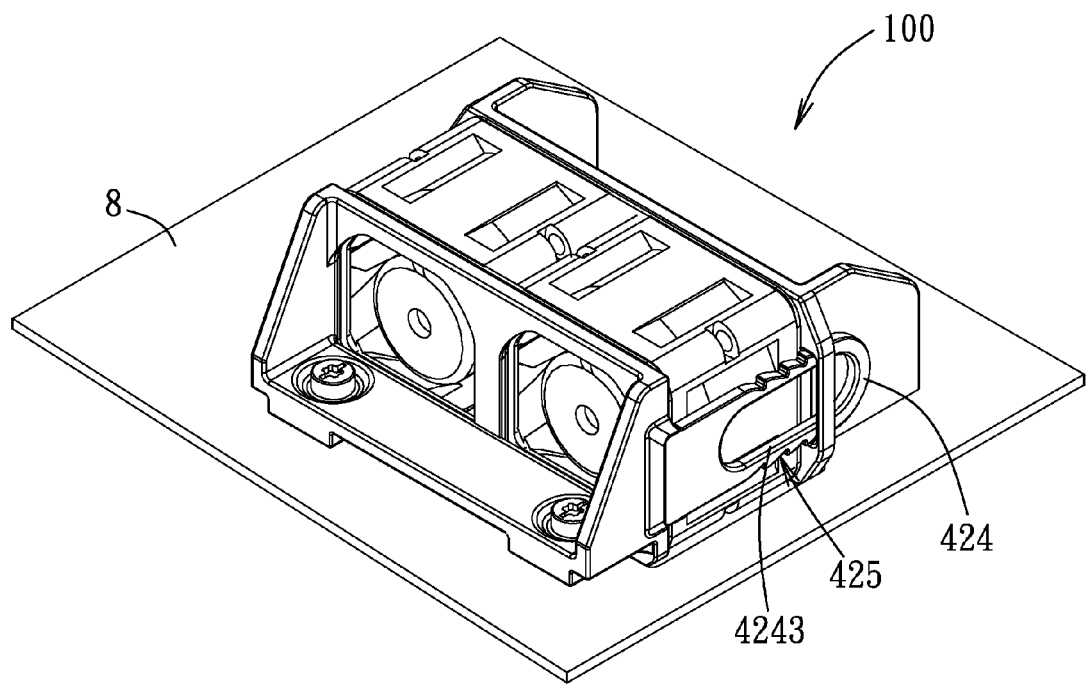
FIG. 8 is a perspective view of a second embodiment of the fan assembly according to the present disclosure.
Figure 9:
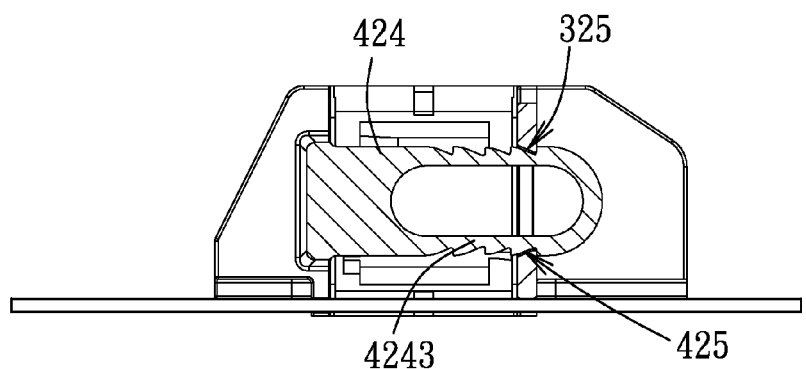
FIG. 9 is a sectional view illustrating the second embodiment.
Figure 10:
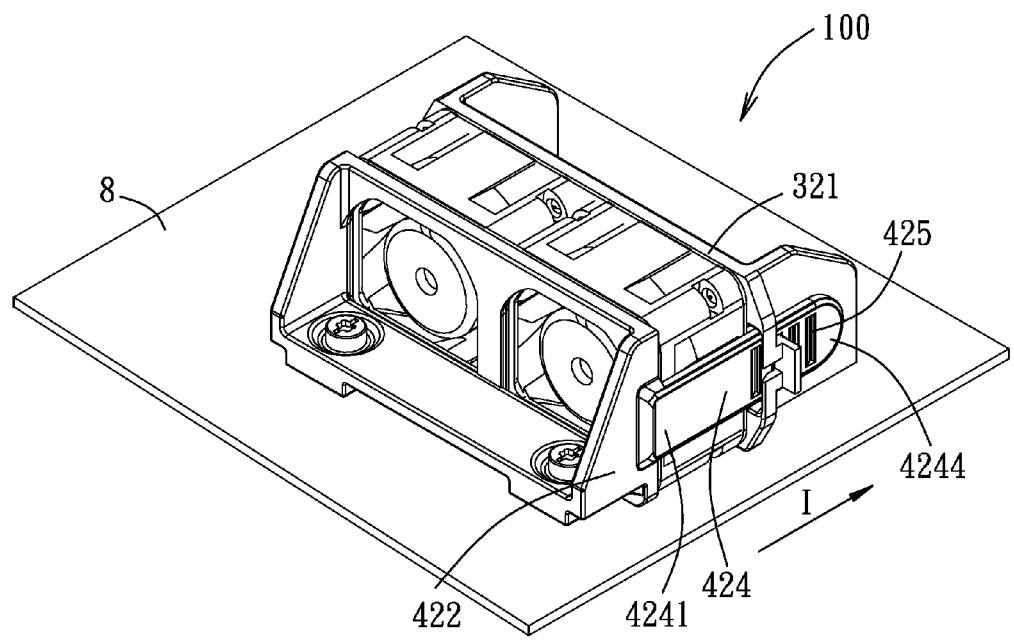
FIG. 10 is a perspective view of a third embodiment of the fan assembly according to the present disclosure.
Figure 11:
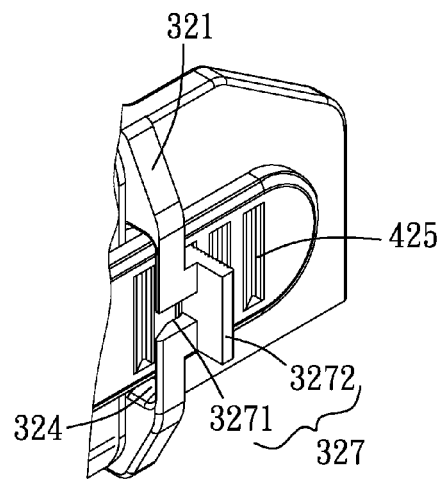
FIG. 11 is a fragmentary perspective view of the third embodiment, illustrating a connecting arm and a flexible section of a first frame body of the third embodiment.

Referring to FIGS. 8 and 9, a second embodiment of the fan assembly 100 according to the present disclosure has a structure similar to that of the first embodiment. The main difference between the second embodiment and the first embodiment resides in the following. In this embodiment, each of the second locking units 425 has two engaging grooves formed respectively in opposite sides of the flexible portion 4243 of the corresponding connecting arm 424, and each of the first locking units 325 includes two stop blocks protruding toward each other for respectively engaging the engaging grooves of one of the second locking units 425.

Referring to FIGS. 10 to 13, a third embodiment of the fan assembly 100 according to the present disclosure has a structure similar to that of the first embodiment. The main difference between the third embodiment and the first embodiment resides in the following. In this embodiment, each of the connecting arms 424 has a base portion 4241 connected to the respective one of the second side plates 422, and an extending portion 4244 extending from the base portion 4241 in the extending direction (I). The second locking units 425 are formed on the extending portions 4244 of the connecting arms 424. Each of the second locking units 425 is configured as an elongated engaging hole. Each of the first locking units 325 is configured as a protruding rib for engaging the engaging hole of one of the second locking units 425. Moreover, the first frame body 321 further has two flexible sections 327 respectively corresponding in position to the holding slots 324. Each of the flexible sections 327 has a gap 3271 and a pressing portion 3272 spanning the gap 3271 and extending outwardly in the first direction (X). The first locking units 325 respectively extend inwardly from the pressing portions 3272.

Referring to FIGS. 14 to 17, a fourth embodiment of the fan assembly 100 according to the present disclosure has a structure similar to that of the first embodiment.

Figure 16:
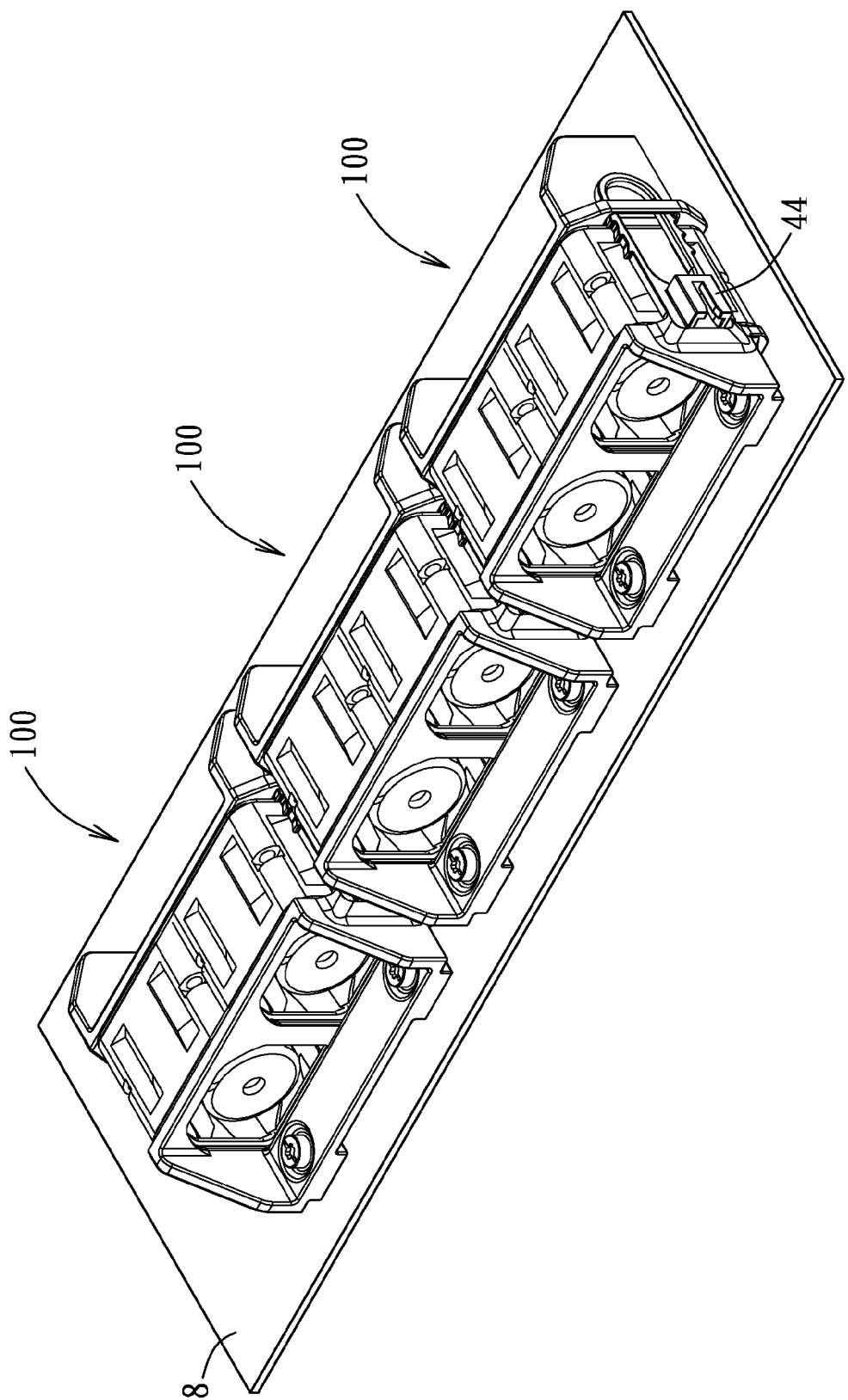
FIG. 16 is a perspective view illustrating a plurality of the fourth embodiments connected together.
Figure 17:
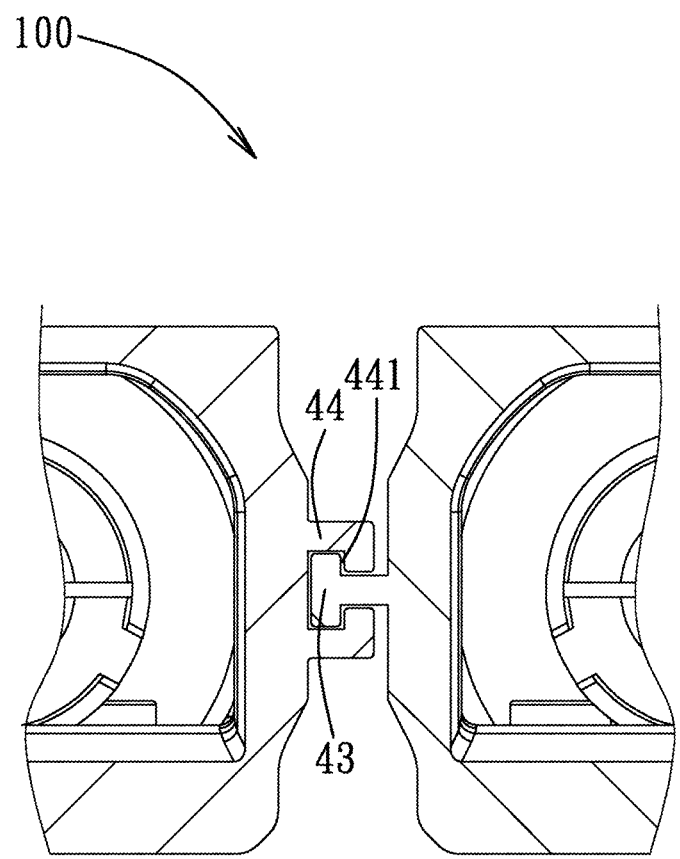
FIG. 17 is a fragmentary sectional view illustrating a male connecting member of one of the fourth embodiments connected to a female connecting member of an adjacent one of the fourth embodiments.

The main difference between the fourth embodiment and the first embodiment resides in the following. The second holder 4 further includes a connecting mechanism including a male connecting member 43 and a female connecting member 44 that are respectively and symmetrically provided on the base portions 4241 of the connecting arms 424. In particular, the male connecting member 43 is a T-shaped block, and the female connecting member 44 has a T-shaped receiving groove 441. As shown in FIG. 16 and FIG. 17, when more than two fan assemblies 100 are aligned, the male connecting member 43 of one of the fan assemblies 100 is engaged with the female connecting member 44 of an adjacent one of the fan assemblies 100 for coupling the pair of the fan assemblies 100 together. This embodiment uses three fan assemblies 100 as an example, where the middle one of the fan assemblies 100 is coupled to the right one of the fan assemblies 100 via engagement between its female connecting member 44 and the male connecting member 43 of the right one of the fan assemblies 100, and is coupled to the left one of the fan assemblies 100 via engagement between its male connecting member 43 and the female connecting member 44 of the left one of the fan assemblies 100. Thus, the three fan assemblies 100 can be easily and simultaneously mounted onto the board 8. The number of fan assemblies 100 being joined together may be adjusted as desired.

To sum up, the fan assembly 100 according to the present disclosure combines at least one cooling fan 1 and a fan securing device 2 into an assembly, which facilitates installation of the same onto the board 8. Moreover, the fan securing device 2 and the cooling fan 1 may be easily assembled without the use of bolts or other securing members. Shock absorbing members 5 may be respectively disposed between the cooling fan 1 and the first holder 3 and between the cooling fan 1 and the second holder 4 so as to reduce a resonance effect due to vibration when the cooling fan 1 is in operation. Furthermore, the fan securing device 2 is suitable for a variety of cooling fans 1 having different thicknesses (T), thereby simplifying an overall manufacturing process and reducing an overall manufacturing cost required to accommodate different sized cooling fans. Furthermore, a plurality of the fan assemblies 100 of the disclosure may be connected together as desired.

While the present disclosure has been described in connection with what are considered the most practical embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A fan securing device adapted to be secured to at least one cooling fan for an electronic device, said fan securing device comprising:
    a first holder including
        a first base, and
        a first holding frame that is connected perpendicularly to said first base, and that has a first surface, two holding slots respectively located at opposite sides of said first holding frame and formed in said first surface, and two first locking units respectively formed adjacent to said holding slots; and
    a second holder including
        a second base, and
        a second holding frame that is connected perpendicularly to said second base, and that has a second surface and two connecting arms respectively located at opposite sides of said second holding frame, extending beyond said second surface in an extending direction and extendable respectively into said holding slots, each of said connecting arms being formed with a plurality of second locking units spaced apart from each other in the extending direction, each of said first locking units engaging a selected one of said second locking units of the respective one of said connecting arms so as to clamp the cooling fan between said first surface and said second surface.

2. The fan securing device of claim 1, the cooling fan being formed with a plurality of positioning holes located respectively at corners thereof and extending therethrough, wherein said first holding frame further includes a plurality of positioning protrusions protruding from said first surface and adapted to respectively extend into the positioning holes, said second holding frame further including a plurality of positioning protrusions that protrude from said second surface and that are that are adapted to respectively extend into the positioning holes.

3. The fan securing device of claim 2, further comprising two hollow shock absorbing members which are respectively provided on said first surface of said first holding frame and said second surface of said second holding frame, and each of which has a plurality of hollow projections respectively sleeved on said positioning protrusions of the respective one of said first and second holding frames.

4. The fan securing device of claim 1, wherein said first holding frame further includes a first frame body having said first surface and two first side plates spaced apart from each other in a first direction transverse to the extending direction and connected perpendicularly to said first frame body and said first base, opposite sides of said first frame body protruding oppositely and respectively from said first side plates in the first direction and being formed respectively with said holding slots, said second holding frame further including a second frame body that has said second surface and two second side plates that are spaced apart from each other in the first direction and that are connected perpendicularly to said second frame body and said second base, said connecting arms respectively extending from said second side plates.

5. The fan securing device of claim 4, wherein each of said connecting arms has a base portion connected to a respective one of said second side plates, and a flexible portion extending from said base portion in the extending direction and having a through hole so as to have a U-shaped structure that opens toward said base portion, said second locking units being formed on said flexible portions of said connecting arms.

6. The fan securing device of claim 5, wherein each of said second locking units has two protruding blocks protruding respectively from opposite sides of said flexible portion of a corresponding one of said connecting arms in a second direction transverse to the extending direction and the first direction, each of said first locking units including two stop blocks that protrude toward each other for respectively engaging said protruding blocks of the selected one of said second locking units.

7. The fan securing device of claim 5, wherein each of said second locking units has two engaging grooves formed respectively in opposite sides of said flexible portion of a corresponding one of said connecting arms in a second direction transverse to the extending direction and the first direction, each of said first locking units including two stop blocks that protrude toward each other for respectively engaging said engaging grooves of the selected one of said second locking units.

8. The fan securing device of claim 4, wherein each of said connecting arms has a base portion connected to a respective one of said second side plates, and an extending portion extending from said base portion in the extending direction, said second locking units being formed on said extending portions of said connecting arms, each of said second locking units being configured as an elongated engaging hole, each of said first locking units being configured as a protruding rib that engages said engaging hole of the selected one of said second locking units.

9. The fan securing device of claim 8, wherein said first frame body further has two flexible sections respectively corresponding in position to said holding slots, each of said flexible sections having a gap and a pressing portion that spans said gap and that extends outwardly in the first direction, said first locking units respectively extending inwardly from said pressing portions of said flexible sections.

10. The fan securing device of claim 4, wherein said second holder further includes a connecting mechanism including a male connecting member and a female connecting member that are respectively and symmetrically provided on said connecting arms at positions close to said second side plates.

11. A fan assembly, comprising:
at least one cooling fan for an electronic device; and
a fan securing device including
a first holder that includes
a first base, and
a first holding frame connected perpendicularly to said first base, and having a first surface, two holding slots that are respectively located in opposite sides of said first holding frame and that are formed in said first surface, and two first locking units that are respectively formed adjacent to said holding slots, and
a second holder that includes
a second base, and
a second holding frame connected perpendicularly to said second base, and having a second surface and two connecting arms that are respectively located on opposite sides of said second holding frame, that extend beyond said second surface in an extending direction and that extend respectively into said holding slots, each of said connecting arms being formed with a plurality of second locking units spaced apart from each other in the extending direction, each of said first locking units engaging a selected one of said first locking units of a respective one of said connecting arms, so as to clamp said cooling fan between said first surface and said second surface.

12. The fan assembly of claim 11, wherein said cooling fan is formed with a plurality of positioning holes located respectively at corners thereof and extending therethrough, said first holding frame further including a plurality of positioning protrusions that protrude from said first surface and that respectively extend into said positioning holes, said second holding frame further including a plurality of positioning protrusions that protrude from said second surface and that respectively extend into said positioning holes.

13. The fan assembly of claim 12, wherein said fan securing device further includes two hollow shock absorbing members respectively provided on said first surface of said first holding frame and said second surface of said second holding frame, and each of which has a plurality of hollow projections respectively sleeved on said positioning protrusions of the respective one of said first and second holding frames.

14. The fan assembly of claim 11, wherein said first holding frame further includes a first frame body having said first surface and two first side plates spaced apart from each other in a first direction transverse to the extending direction and connected perpendicularly to said first frame body and said first base, opposite sides of said first frame body protruding oppositely and respectively from said first side plates in the first direction and being formed respectively with said holding slots, said second holding frame further including a second frame body that has said second surface and two second side plates that are spaced apart from each other in the first direction and that are connected perpendicularly to said second frame body and said second base, said connecting arms respectively extending from said second side plates.

15. The fan assembly of claim 14, wherein said each of said connecting arms has a base portion connected to a respective one of said second side plates, and a flexible portion extending from said base portion in the extending direction and having a through hole so as to have a U-shaped structure that opens toward said base portion, said second locking units being formed on said flexible portions of said connecting arms.

16. The fan assembly of claim 15, wherein each of said second locking units has two protruding blocks that protrude respectively from opposite sides of said flexible portion of a corresponding one of said connecting arms in a second direction transverse to the extending direction and the first direction, each of said first locking units including two stop blocks protruding toward each other for respectively engaging said protruding blocks of the selected one of said second locking units.

17. The fan assembly of claim 15, wherein each of said second locking units has two engaging grooves formed respectively in opposite sides of said flexible portion of a corresponding one of said connecting arms in a second direction transverse to the extending direction and the first direction, each of said first locking units including two stop blocks that protrude toward each other for respectively engaging said engaging grooves of the selected one of said second locking units.

18. The fan assembly of claim 14, wherein each of said connecting arms respectively have a base portion connected to a respective one of said second side plates, and an extending portion extending from said base portion in the extending direction, said second locking units being formed on said extending portions of said connecting arms, each of said second locking units being configured as an elongated engaging hole, each of said first locking units being configured as a protruding rib that engages said engaging hole of the selected one of said second locking units.

19. The fan assembly of claim 18, wherein said first frame body further has two flexible sections respectively corresponding in position to said holding slots, each of said flexible sections having a gap and a pressing portion that spans said gap and that extends outwardly in the first direction, said first locking units respectively extending inwardly from said pressing portions of said flexible sections.

20. The fan assembly of claim 14, wherein said second holder further includes a connecting mechanism including a male connecting member and a female connecting member that are respectively and symmetrically provided on said connecting arms at positions close to said second side plates.

* * * * *